United States Patent
Arvelo et al.

(10) Patent No.: US 9,490,188 B2
(45) Date of Patent: Nov. 8, 2016

(54) COMPUTE INTENSIVE MODULE PACKAGING

(71) Applicant: International Business Machines Corporation, Armonk, NY (US)

(72) Inventors: Amilcar R. Arvelo, Poughkeepsie, NY (US); Michael J. Ellsworth, Lagrangeville, NY (US); Eric J. McKeever, Poughkeepsie, NY (US); Thong N. Nguyen, Poughkeepsie, NY (US); Edward J. Seminaro, Milton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/485,225

(22) Filed: Sep. 12, 2014

(65) Prior Publication Data

US 2016/0079140 A1    Mar. 17, 2016

(51) Int. Cl.
| | |
|---|---|
| H01L 23/10 | (2006.01) |
| H01L 23/34 | (2006.01) |
| H01L 23/367 | (2006.01) |
| H05K 3/30 | (2006.01) |
| H01L 23/42 | (2006.01) |
| H01L 23/473 | (2006.01) |

(52) U.S. Cl.
CPC .............. *H01L 23/367* (2013.01); *H01L 23/34* (2013.01); *H01L 23/42* (2013.01); *H01L 23/473* (2013.01); *H05K 3/30* (2013.01)

(58) Field of Classification Search
CPC ... H01L 23/34; H01L 23/367; H01L 23/473; H01L 23/42; H05K 1/0212
See application file for complete search history.

(56) References Cited

U.S. PATENT DOCUMENTS

| | | | | |
|---|---|---|---|---|
| 5,396,403 | A | * | 3/1995 | Patel ..................... H01L 23/433 257/713 |
| 6,233,153 | B1 | * | 5/2001 | Baur ..................... H05K 5/006 361/752 |
| 6,404,638 | B1 | | 6/2002 | Messina |
| 6,937,474 | B2 | | 8/2005 | Lee |
| 7,119,433 | B2 | | 10/2006 | Corbin, Jr. et al. |
| 7,132,746 | B2 | * | 11/2006 | Brandenburg ......... B23K 35/26 257/678 |
| 7,186,590 | B2 | | 3/2007 | Alcoe et al. |
| 7,778,044 | B2 | * | 8/2010 | Inaba ....................... H03J 1/00 174/520 |
| 2003/0010477 | A1 | * | 1/2003 | Khrustalev ........ H05K 7/20681 165/104.33 |
| 2005/0128705 | A1 | * | 6/2005 | Chu ...................... H01L 23/473 361/699 |
| 2006/0044768 | A1 | * | 3/2006 | Mizutani ................ H05K 5/006 361/752 |
| 2007/0159797 | A1 | * | 7/2007 | Teneketges ........... H01L 23/473 361/699 |
| 2008/0089024 | A1 | | 4/2008 | McAllister et al. |
| 2009/0213541 | A1 | | 8/2009 | Butterbaugh et al. |

(Continued)

*Primary Examiner* — Jesse Y Miyoshi
(74) *Attorney, Agent, or Firm* — Steven L. Bennett; Jack V. Musgrove

(57) ABSTRACT

A package for a multi-chip module includes a top cold plate and a bottom plate whose perimeters are in thermal communication so the plates together completely encase the module except for a connector passing through the bottom plate. The cold plate has copper tubing pressed into a groove formed in a serpentine pattern. The perimeter of the cold plate has thermal conduction fins which mate with thermal conduction slots in the perimeter of the bottom plate. Thermal interface material is disposed in gaps between the plates and chips on the module, the gaps having dimensions controlled by support ribs of plates which abut the module substrate. The cold plate is used on the hottest side of the module, e.g., the side having computationally-intensive chips such as ASICs. A densely packed array of these packages can be used in a central electronic complex drawer with a shared coolant circulation system.

20 Claims, 5 Drawing Sheets

(56) References Cited

U.S. PATENT DOCUMENTS

2009/0260782 A1* 10/2009 Whitney ............... B21D 53/02
                                                        165/104.21

2011/0199732 A1* 8/2011 Nishiuma .......... H05K 7/20481
                                                        361/704
2012/0069532 A1* 3/2012 Azumi ................ H05K 5/0052
                                                        361/752

* cited by examiner

COMPUTE INTENSIVE MODULE PACKAGING

STATEMENT REGARDING FEDERALLY SPONSORED RESEARCH OR DEVELOPMENT

This invention was made with United States Government support under DARPA Agreement No. H98230-13-D-0122. THE GOVERNMENT HAS CERTAIN RIGHTS IN THIS INVENTION.

BACKGROUND OF THE INVENTION

1. Field of the Invention

The present invention generally relates to packaging for electronic devices or components, and more particularly to a package for an integrated circuit chip module which includes heat dissipation.

2. Description of the Related Art

Electronic equipment is often very susceptible to changes in operating temperatures, particularly warm temperatures. Excessive temperatures not only can result in a change in the response characteristics of certain electrical devices (such as semiconductor devices), but can further damage such devices beyond repair. Thermal management of electronic equipment has become even more difficult with the increasing miniaturization of electronic devices.

Components for computer systems can be particularly sensitive to high temperatures and, in the case of computationally intensive devices such as microprocessors or application-specific integrated circuits, are themselves the primary source of the heating. This problem is exacerbated in multi-chip modules which may carry several heat-generating chips in a compact setting. A variety of methods have been devised to cool off such devices, the primary approach being the use of a heat sink. The heat sink is usually a metallic block, such as aluminum, and is either in direct contact with one side of the particular integrated circuit chip or is only separated therefrom by a thin layer of thermal interface material. Air cooling is also common (e.g., a fan mounted proximate the chip), and is often used in conjunction with heat sinks. In advanced applications, cold plates are used. A cold plate is essentially a heat sink that is directly cooled via a circulating fluid, such as water that passes through or is otherwise in contact with the heat sink material. In high performance server systems cold plates are typically used on higher-power density components (e.g., processors) and the rest of the components are air cooled.

SUMMARY OF THE INVENTION

The present invention is generally directed to a package for an integrated circuit chip module comprising a substrate, integrated circuit chips mounted on a top surface of the substrate, a first (top) heat sink in thermal communication with at least one of the integrated circuit chips, and a second (bottom) heat sink located opposite the first heat sink with respect to the substrate, at least a portion of the first heat sink being in contact with a portion of the second heat sink, the first and second heat sinks together substantially surrounding the integrated circuit chips. In the preferred embodiment the first heat sink is a cold plate having a first surface in thermal communication with the integrated circuit chips, a second surface with a groove formed therein in a serpentine pattern, and copper tubing pressed into said groove to receive a circulating coolant. A perimeter of the cold plate can have thermal conduction fins which mate with corresponding thermal conduction slots formed along a perimeter of the bottom plate. Another set of integrated circuit chips can be mounted on the bottom surface of the substrate, along with a connector block that passes through a connector cutout in the bottom plate, so the cold plate and the bottom plate effectively encase all of the chips (except for space formed by the connector cutout). Thermal interface material may be disposed in a first gap between the cold plate and one of the upper chips, and in a second gap between the bottom plate and one of the lower chips, wherein the gaps have dimensions controlled by support ribs of the cold plate and the bottom plate which forcibly abut portions of the substrate. The cold plate is preferably used on the hottest side of the module, e.g., the side having computationally-intensive chips such as ASICs. A densely packed array of these packages can be used in a central electronic complex drawer.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

As noted above, thermal management in state-of-the-art electronic systems has become more difficult not only because of the increasingly smaller sizes of the electronic components, but also because of the increasing amounts of heat those components are generating. This problem is compounded by the desire to squeeze more components into a smaller space, making it impossible to achieve meaningful airflow around the components. While heat sinks and cold plates are useful in providing limited cooling to the components that they are directly in contact with, the thermal management structures of the prior art do not provide adequate heat dissipation for more complex modules having multiple chips, particularly modules having devices or components on both sides of the module substrate. It would, therefore, be desirable to devise an improved method of cooling a multi-chip module which could allow for more efficient heat transfer around the entire module. It would be further advantageous if the method could allow for very dense arrays of modules to be packaged in a tight configuration.

The present invention solves the problem of how to better cool densely packaged electronics by sandwiching the module card or substrate between top and bottom plates, wherein at least one of the plates (e.g., the top plate) is an integrated cold plate. The perimeters of the integrated cold plate and bottom plate are substantially in thermal communication, preferably using a fin-in-slot (tongue-and-groove) construction. The gap between the fin and slot can be filled with a gap-filler thermal interface material to enhance the thermal communication. This approach effectively allows water cooling of all components (high and low power density) contained within the package structure. No airflow is needed, so these modules can be very densely packed.

Figure 1:
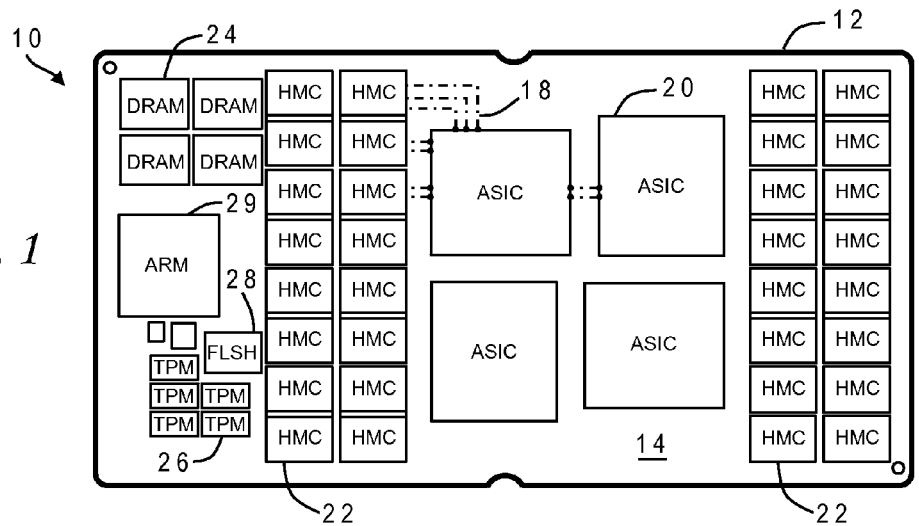
FIG. 1 is a top plan view of one embodiment of a multi-chip module which may be packaged in accordance with the present invention.
Figure 2:
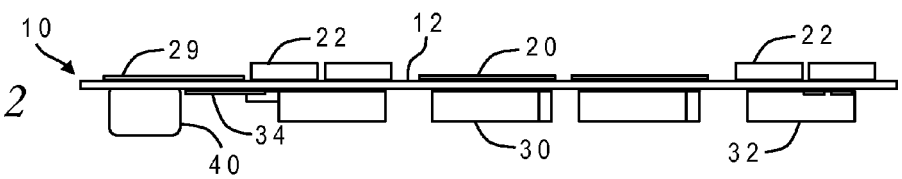
FIG. 2 is a front elevational view of the multi-chip module of FIG. 1.
Figure 3:
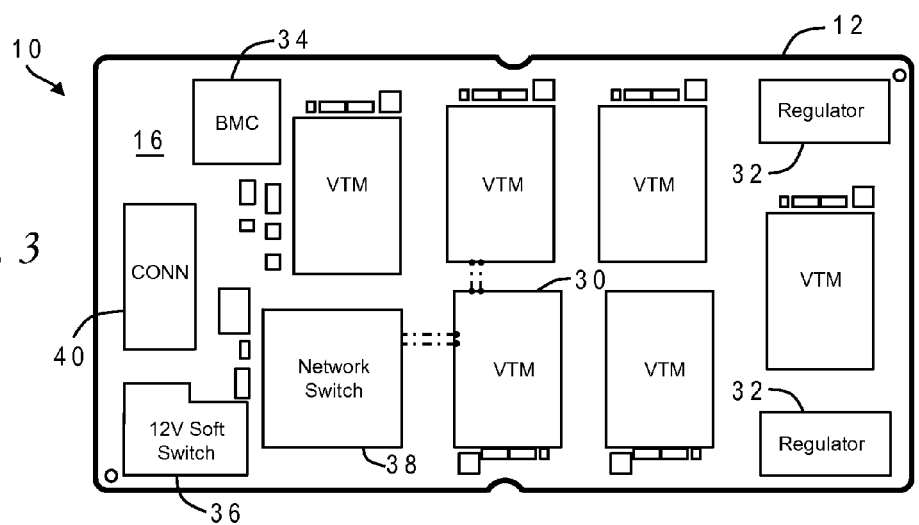
FIG. 3 is a bottom plan view of the multi-chip module of FIG. 1.

With reference now to the figures, and in particular with reference to FIGS. 1-3, there is depicted one embodiment 10 of a multi-chip module (MCM) for which thermal packaging is desired. In this example, MCM 10 is generally comprised of a substrate 12 and a plurality of integrated circuit chips (semiconductor devices or components) mounted on both sides of substrate 12. Substrate 12 is generally planar and rectangular (elongate), and may be formed of any conventional material such as organic laminate or ceramic. Substrate 12 has connection features formed thereon which are operatively interconnected with connection points of the integrated circuit devices or components, i.e., signal traces or tracks formed on one or both surfaces (top and bottom) using a conductive material such as copper, with contact pins, tines, sockets, pads or strips at terminal ends of the traces. Representative signal traces 18 are seen in FIG. 1 but are otherwise omitted to reduce congestion in the drawings. Components may be adhesively bonded or mechanically fastened to the substrate, and electrical connections may be completed using various technologies such as solder balls (e.g., controlled collapse chip connection, or "C4") or surface mount technology. Alternatively, the devices or components can be deposited on the substrate using thin film technology.

FIG. 1 shows the top surface 14 of the module substrate while FIG. 3 shows the bottom surface 16 of the substrate. Devices or components mounted to top surface 14 include four application-specific integrated circuits (ASICs) 20, several columns of hybrid memory cubes (HMCs) 22, dynamic random-access memory (DRAM) chips 24, trusted platform modules (TPMs) 26, flash memory 28, and an ARM processor 29. ASICs 20 (which act as processors) and HMCs 22 have the highest power dissipation densities among all of the devices or components on module 10, so they are intentionally placed on the top surface of the substrate in order to be located as close as possible to the integrated cold plate which, in the illustrative package embodiment described further below, is the top plate. Devices or components mounted to bottom surface 16 of the module include six voltage transformation modules (VTMs) 30 which are used to supply power to the other devices or components mounted on top surface 14, two buck regulators 32 (1.5 volt and 3.3 volt) for DC voltage transformation and regulation, a baseboard management controller (BMC) 34, a 12 volt soft switch 36, a network switch 38, and a surface mount connector 40 which provides interconnections with components external to module 10, e.g., via a printed circuit board, midplane, motherboard, etc. Thus, power regulation and input/output (I/O) functions are generally located on the bottom side of substrate 12. Module 10 may include other electronic devices not shown such as clock crystals, low-dropout regulators, oscillators, fan-out buffers, and serial electrically-erasable programmable read-only memory (SEEPROM). All of these components are mounted on substrate 12 in such a manner as to result in a slim profile as seen in FIG. 2 which allows tighter packaging of the module.

MCM 10 is described herein as only one example of how a thermal package may be designed for a given module, and its construction details should not be construed in a limiting sense. Those skilled in the art will appreciate that the invention can be applied to any chip module (single or multi-) regardless of the particular layout or interconnection of devices or components.

Figure 4:
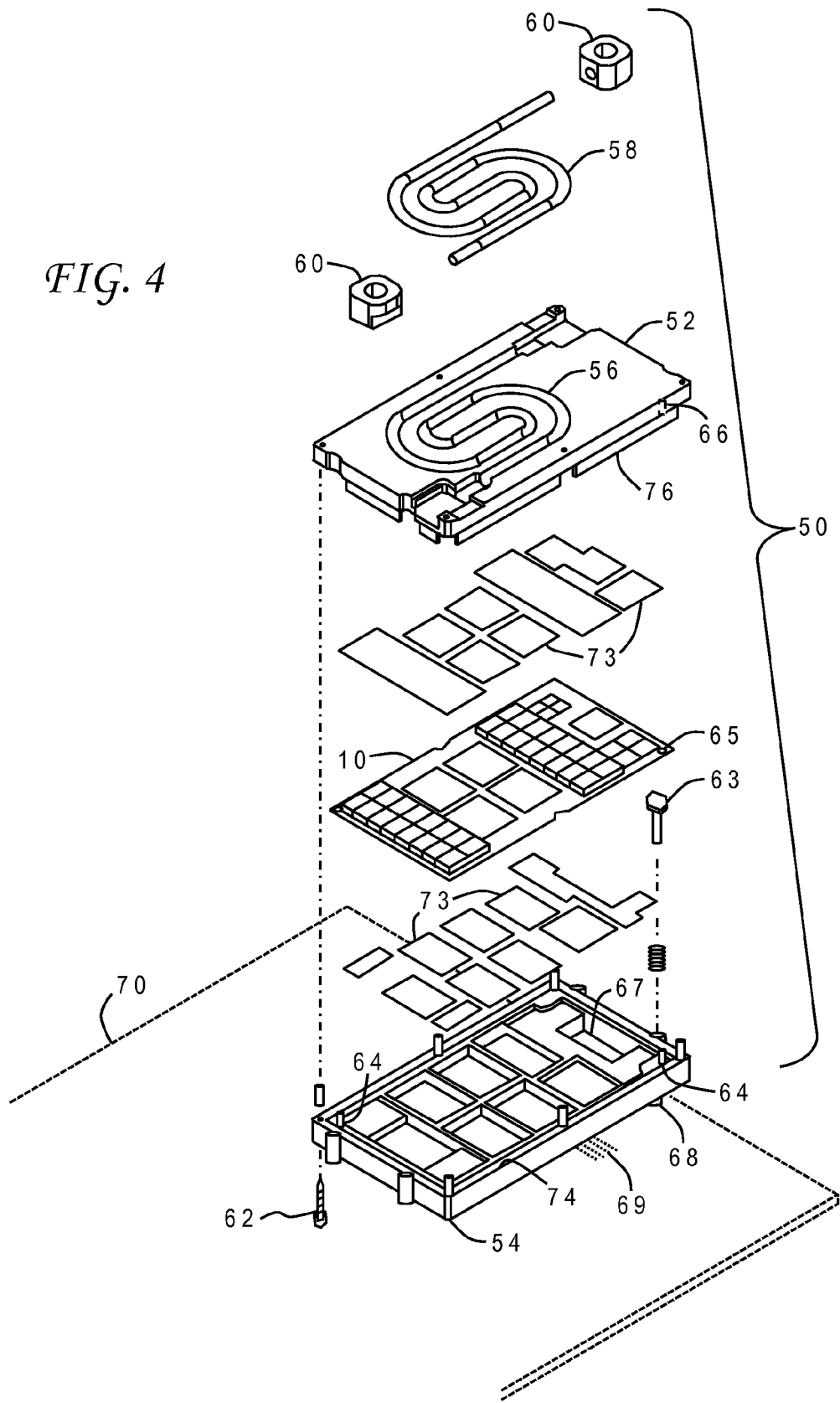
FIG. 4 is an exploded perspective view of a module package constructed in accordance with one implementation of the present invention.

Referring now to FIG. 4, there is depicted one embodiment of an MCM package 50 constructed in accordance with the present invention, in unassembled form. Package 50 includes MCM 10 so some details of package 50 may be based in part on the particular construction of MCM 10, and those details may change to conform with different MCM designs. Package 50 also includes a top plate 52 and a bottom plate 54, both of which are generally rectangular to match the outline of substrate 12 of MCM 10, i.e., the perimeter of top and bottom plates 52, 54 is slightly larger than the perimeter of MCM 10. In the illustrative implementation bottom plate 54 is a passive heat sink and top plate 52 is a cold plate having a conduit therein for receiving circulating coolant. Bottom plate 54 could have active heat pipes as well. In the preferred embodiment the conduit comprises a serpentine channel or groove 56 formed in the upper (outside) surface of the cold plate which receives a similarly-shaped segment of copper tubing 58. The serpentine pattern has two outer hairpin turns and two inner hairpin turns. Other channel/tubing patterns can be used, and alternative cooling technologies can be used altogether such as straight fins/channels. Copper tubing 58 can be pressed into channel 56 and secured with solder or epoxy, i.e., the copper tubing is in thermal communication with the top plate. Chilled water or other liquid circulating through tubing 58 thus provides active cooling to cold plate 52. Other coolants may be used besides water, such as chlorofluorocarbons, hydrocarbon refrigerants (e.g., a propane/isobutane blend), ethylene glycol, or natural refrigerants (ammonia or carbon dioxide).

In the exemplary embodiment, the copper coil is not centered within the top plate. Rather, the geometric center of the copper coil is offset slightly toward one end of the cold plate. The offset places most of the coil closer to the processor (ASIC) area of the module once the package is assembled. This cold plate design is thus optimized for this specific module application since the ASIC chips have the highest power density and require the most cooling.

Cold plate 52 (and bottom plate 54) may be constructed of any durable material having a high thermal conductivity, preferably a metal or metallic alloy that can be easily fabricated and machined, such as aluminum. The ends of tubing 58 are joined (i.e., brazed, soldered, welded, epoxied, etc.) to and in fluid communication with two manifold blocks 60 which fit into corresponding cavities formed in the upper surface of cold plate 52 at opposing corners, the ends of serpentine channel 54 terminating at these cavities. Manifold blocks 60 are preferably constructed of copper, brass, or stainless steel. Bail mechanisms (not shown in FIG. 4 but visible in FIG. 9) provide retention to manifold blocks 60 with separable water connections.

Cold plate 52 has six holes formed therein (one at each corner and two at the midpoints of the lengthwise sides) which receive releasable fasteners such as six screws 62 (only one of which is shown in FIG. 4) that pass through bottom plate 54. Four captive fasteners 63 (only one of which is shown in FIG. 4) can be used to retain bottom plate 54 to a planar board 70 or other support structure. Bottom plate 54 has two integrally formed alignment pins 64 on its upper surface that correspond to an alignment hole 65 formed in MCM 10 and a socket 66 in the lower surface of cold plate 52 to ensure proper registration of the plates around the module. Bottom plate 54 also has a cutout 67 for the module connector 40 to protrude through, to make interconnections with connection features 69 of planar board 70. The lower surface of bottom plate 54 can have features for registering electrical connector 40 with connection features of planar board 70, such as an alignment dowel 68 which fits in a corresponding hole of planar board 70.

Figure 5:
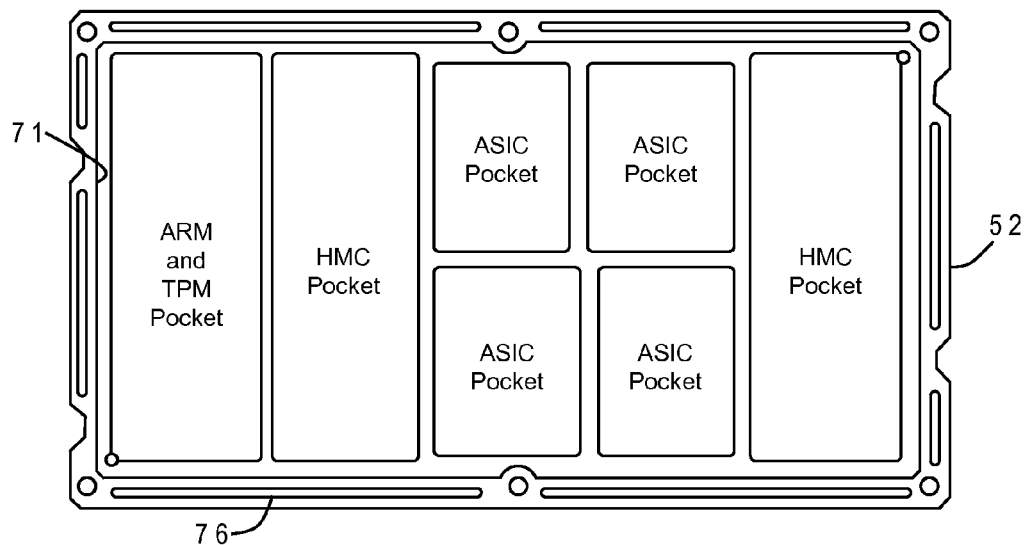
FIG. 5 is a bottom plan view of the top (cold) plate of the module package of FIG. 4.
Figure 6:
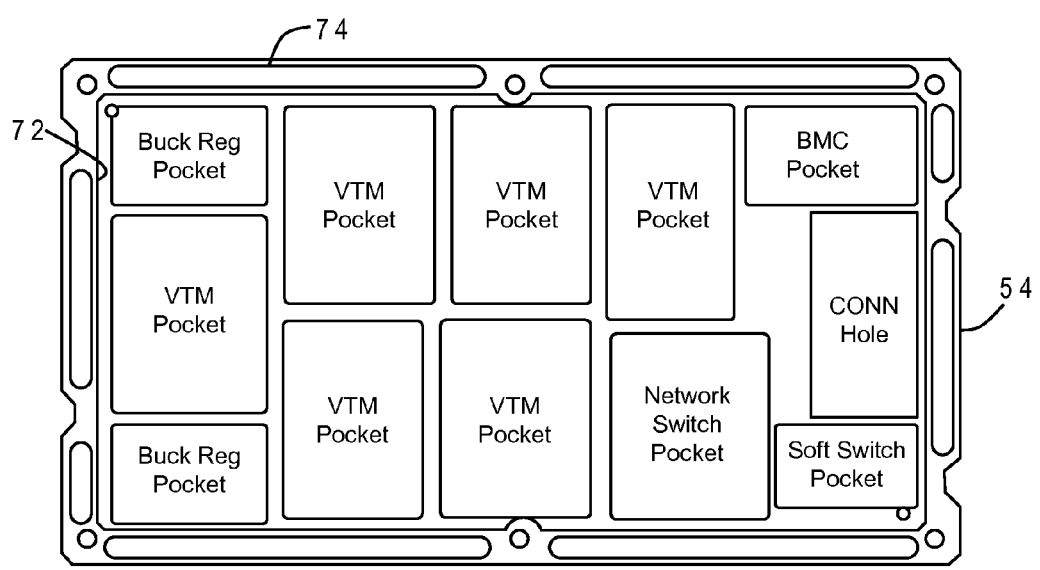
FIG. 6 is a top plan view of the bottom plate of the module package of FIG. 4.

As further depicted in FIGS. 5 and 6, the inside surfaces of top and bottom plates 52, 54 have indentations or pockets of varying depths, sized to accommodate one or more of the devices or components mounted to substrate 12. The lower surface of top plate 52 has four ASIC pockets, two HMC pockets, and an ARM/TPM pocket as seen in FIG. 5. All of these pockets are contained within a larger cavity or compartment 71 whose perimeter is slightly larger than the perimeter of substrate 12 to accommodate module 10. The upper surface of bottom plate 54 has six VTM pockets, two regulator pockets, a BMC pocket, a soft switch pocket, and a network switch pocket as seen in FIG. 6. All of these pockets are similarly contained within a larger cavity or compartment 72 whose perimeter is again slightly larger than the perimeter of substrate 12 so module 10 can be secured in bottom plate 54. Features of the top and bottom plates can be formed by various methods, primarily machine milling. While top and bottom plates 52, 54 are preferably each a single piece, they may alternatively be constructed from multiple blocks of heat sink material which are then attached by conventional means.

Strips of thermal interface material (TIM) 73 (FIG. 4) in varying shapes can be used to improve the thermal interfaces between the devices or components and the inside surfaces of top and bottom plates 52, 54 by locating the TIMs in these pockets before the MCM is lowered into the bottom plate and before the top plate is lowered onto the MCM and then secured to the bottom plate. Generally any conventional thermal interface material is sufficient, for example, the elastomeric thermal interface material sold by The Berquist Company of Chanhassen, Minn., under the Sil-Pad brand. However, it is deemed preferable to use an even more efficient thermal material over the ASICs because they have the highest power density, significantly higher than the other components. For example, the curable thermal gel sold by Shin-Etsu MicroSi, Inc., of Phoenix, Ariz., may be used for the ASICs.

Figure 7:
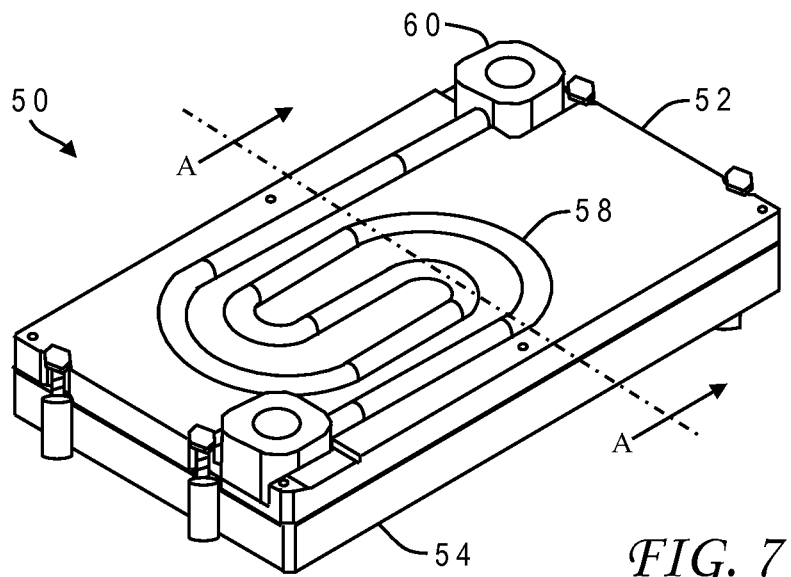
FIG. 7 is a perspective view of the assembled module package of FIG. 4.
Figure 8:
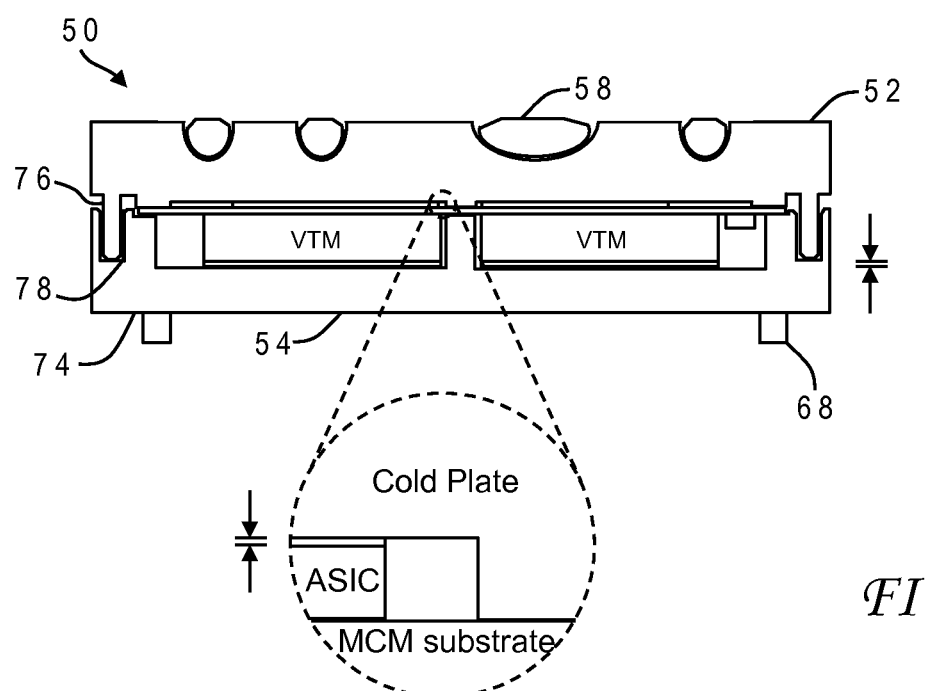
FIG. 8 is a cross-sectional view of the assembled module package of FIG. 4 taken along line A-A of FIG. 7.

Bottom plate 54 has thermal conduction slots 74 formed along the perimeter of its upper surface which mate with corresponding thermal conduction fins 76 integrally formed with top plate 52 along the perimeter of its bottom surface, to create a thermal conduction path from the bottom plate to the top plate along substantially the entire perimeter of the assembled package 50 as illustrated in FIGS. 7 and 8. The result is a "thermal Faraday cage" in which module 10 is essentially completely surrounded by the heat sink material of top and bottom plates 52, 54, except for the hole 67 in bottom plate 54 to allow passage of connector block 40. This thermal Faraday cage can be advantageous even without the use of a cold plate but making one of the heat sinks a cold plate provides even greater heat dissipation qualities, superior to any prior art module packaging, while still maintaining a small footprint. The higher-power density devices or components on the top surface of module 10 (e.g., ASICs 20) not only have the benefit of active cooling from cold plate 52, but the heat-generating components on the bottom side of the module also benefit since they dissipate heat through bottom plate 54 to cold plate 52 as well. Some of the excess heat from an ASIC on the top surface 14 of substrate 12 might actually be conducted through the substrate and a device or component on the bottom surface 16 to bottom plate 54.

Use of the fin-in-groove arrangement is not essential to creating the thermal Faraday cage effect, but it is preferable since it increases the contacting surface area between top and bottom plates 52, 54, thereby increasing thermal conduction. In other words, slots 74 and fins 76 can be sized such that both sides of a given fin are in contact with both inner walls of a corresponding groove, or separated therefrom by only a very small gap which can be filled with thermal interface material 78, providing direct thermal communication. Package 50 may exhibit other controlled dimensions, particularly for the other thermal interface material gaps. As shown in FIG. 8, the thickness between the outside surface of an ASIC and the cold plate can be carefully controlled by support ribs formed by the pockets in the cold plate which forcibly abut the top side of module substrate 12 when the cold plate is secured to the bottom plate. The thickness between the outside surface of a VTM and the bottom plate can be similarly controlled by support ribs formed by the pockets in the bottom plate which forcibly abut the bottom side of module substrate 12. By using the module substrate in this manner to set a reference height for the gaps, variations in substrate thickness do not affect the assembly (the thickness of the MCM substrate can easily vary by ~10%). These controlled dimensions also allow for manufacturing tolerances in plate thicknesses while still providing effectively direct thermal contact between the devices or components and the plates. In the preferred implementation, the thermal interface material gaps adjacent the chips are about 0.001" thick.

Those skilled in the art will appreciate that terms such as "upper", "lower", "bottom", "top" and the like are relative and, while they are very useful in conveying an understanding of the present invention with reference to a particular perspective, they are not meant to be construed in a limiting fashion. A chip module package may have a different physical orientation (e.g., a vertically-disposed module substrate) but the invention may still be applied to such arrangements.

The dimensions of module package 50 may vary considerably depending upon the particular application. The top and bottom plates are preferably as small as feasible while still completely containing the MCM. For a module 10 whose overall size is 90 mm×170 mm, approximate dimensions are as follows. Top and bottom plates 52, 54 are each 102 mm×182 mm. Top plate 52 has a nominal thickness (not considering fins 76) of 10 mm. Bottom plate 54 has a nominal thickness (not considering slots 74) of 14.5 mm. Slots 74 are 7.5 mm deep and 3.5 mm wide. Tubing 58 has an outer diameter of 6.35 mm, with an effective length of 450 mm.

Figure 9:
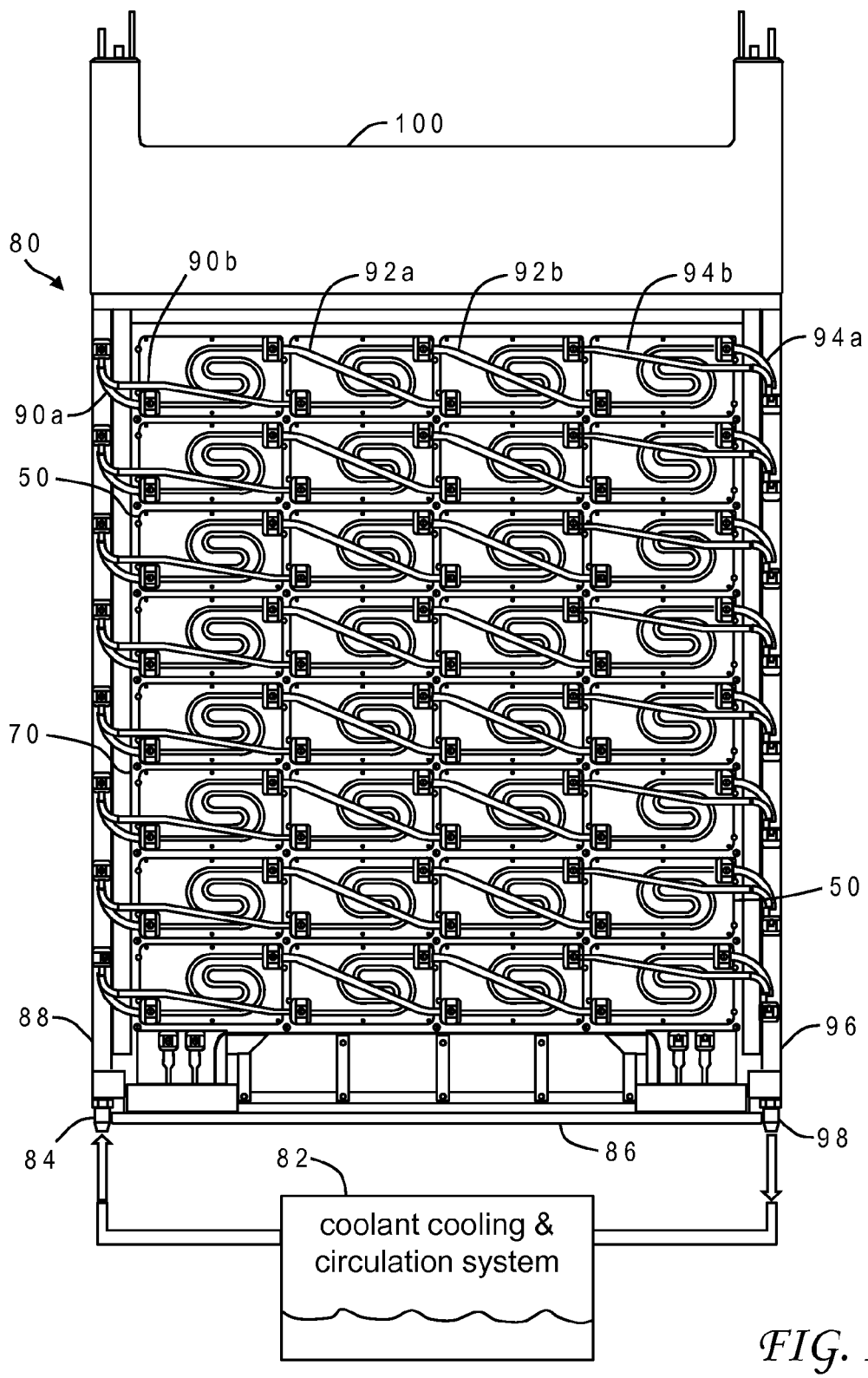
FIG. 9 is a top plan view of one embodiment of a central electronic complex drawer for a computer system having an array of module packages constructed in accordance with the present invention.

The resulting module package 50 provides an extensive electronic system in a very small container with exceptional thermal management. This size advantage can be further leveraged to create a central electronic complex (CEC)

drawer for a computer system with densely packed modules. One embodiment of such a CEC drawer 80 is shown in FIG. 9, where thirty-two compute-intensive module packages 50 are arranged in a 8×4 array (rows and columns) with a shared coolant circulation system. Each module package 50 is generally identical on the exterior and interior, but one or more packages might have a chipset that is different from the others. Chilled coolant from a conventional cooling and circulation system 82 enters a fluid inlet 84 which is affixed to a generally rectangular frame or chassis 86. Chassis 86 can also support the planar board 70 to which the package array is mounted, i.e., each module package has a connector 40 which is interconnected with respective connection features of the planar board. Electrical connections 100 for planar board 70 (e.g., power supply and out of band communications) can be provided at the front of the drawer, with space for cabling, etc. Inlet 84 is in fluid communication with a supply manifold 88 secured to chassis 86 along its left side at the rear of the drawer. Supply manifold 88 branches out to sixteen feeder pipes. In this implementation, feeder pipe 90 branches into feeder pipes 90a, 90b for each row of module packages 50. The first feeder pipe 90a in a given row is connected to the copper tubing of the closest module package, i.e., the leftmost package in FIG. 9. A first pipe link 92a is used to serially connect the copper tubing of this leftmost package to the copper tubing of another module package in the same row but not the immediately adjacent module package, e.g., it is connected to the copper tubing of the third package from the left in the row. The second feeder pipe 90b is connected to the copper tubing of the next closest module package, i.e., the second package from the left in FIG. 9. A second pipe link 92b is similarly used to serially connect the copper tubing of this second package to the copper tubing of another module package in the same row but not the immediately adjacent module package, e.g., it is connected to the copper tubing of the rightmost package. This staggered approach to supplying coolant to the packages is considered an optimal compromise between serially connecting the copper tubing of multiple packages without the final package getting coolant that has already been significantly heated. The outlets of the copper tubing for the two rightmost packages in a row are respectively connected to branch 94a and branch 94b of collection pipe 94. For the entire package array, a total of sixteen collection branches are accordingly connected to a return manifold 96 secured to chassis 86 along its right side. Return manifold 96 is connected to a fluid outlet 98 which is also affixed to chassis 86. Coolant from outlet 98 (now heated by the module packages) returns to cooling and circulation system 82. The joints and connections along the manifolds, pipes and links are sealed by brazing, epoxy, washers, O-rings, etc., to form a closed system for the circulating coolant. In the example of FIG. 9 the package array is generally horizontal, that is, the packages are laid out end-to-end or side-to-side, but the packages could be arranged in other manners, such as a stack with only a small clearance between levels for the piping. Additional water ports may be provided at the front and rear of the drawer for, e.g., cooling the redundant power supplies and infiniban adapters located at the bottom left and bottom right of the drawer.

The present invention accordingly achieves superior thermal management for an extremely dense and computationally-intensive multi-chip module. In practice this construction is able to easily cool a module generating up to 1,200 Watts of heat. The passive bottom plate efficiently conducts heat from components on bottom side of the module card to the cold plate, enhanced by using the fin-in-slot arrangement around the perimeter of the plates. All of the components are effectively water-cooled. Since no airflow is needed with these designs (contrary to conventional thinking), the modules can be very densely packed. Water cooling also enables a very higher power envelope inside the module.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the illustrative implementation provides a cold plate for only the top plate, the invention could be extended to have cold plates for both the top and bottom plates. The invention is also effective for a module which has devices or components mounted to only one side (i.e., the top side) of the module substrate. It is therefore contemplated that such modifications can be made without departing from the spirit or scope of the present invention as defined in the appended claims.

What is claimed is:

1. A package for an integrated circuit chip module comprising:
   a generally planar substrate having first and second opposing surfaces;
   a plurality of integrated circuit chips mounted on said first surface of said substrate;
   a first heat sink provided with a plurality of pockets to accommodate and provide thermal communication with said plurality of integrated circuit chips, said first heat sink having sides forming a perimeter;
   a second heat sink located opposite said first heat sink with respect to said substrate, said second heat sink having sides forming a perimeter which is in continuous direct contact with the perimeter of said first heat sink such that said first and second heat sinks together substantially surrounding said integrated circuit chips on all sides; and
   thermal interface material disposed in a gap between said first heat sink and the at least one of said plurality of integrated circuit chips, wherein said gap has a dimension which is determined by at least one support rib of said first heat sink which forcibly abuts said substrate.

2. The package of claim 1 wherein said first heat sink is a cold plate.

3. The package of claim 2 wherein said cold plate has first and second opposing surfaces, said first surface of said cold plate being in thermal communication with the at least one of said plurality of integrated circuit chips, said second surface of said cold plate having a groove formed therein in a serpentine pattern, and copper tubing pressed into said groove to receive a circulating coolant.

4. The package of claim 1 wherein a perimeter of said first heat sink has one or more thermal conduction fins which mate with one or more corresponding thermal conduction slots formed along a perimeter of said second heat sink.

5. The package of claim 4 further comprising thermal interface material disposed in a gap between one of said thermal conduction fins and one of said thermal conduction slots.

6. The package of claim 1 wherein said second heat sink has at least one alignment pin which extends through a hole in said substrate and into a socket of said first sink.

7. The package of claim 1 wherein the integrated circuit chips are a first plurality of integrated circuit chips, and further comprising a second plurality of integrated circuit chips mounted on said second surface of said substrate.

8. The package of claim 7 wherein the first plurality of integrated circuit chips include one or more processor chips, and the second plurality of integrated circuit chips include one or more power converters which supply power to said one or more processor chips.

9. A multi-chip module package comprising:
a generally rectangular, planar substrate having top and bottom surfaces;
a first plurality of integrated circuit chips mounted on said top surface of said substrate, said top surface having first connection features formed thereon which are operatively interconnected with first connection points of said first plurality of integrated circuit chips;
a second plurality of integrated circuit chips mounted on said bottom surface of said substrate, said bottom surface having second connection features formed thereon which are operatively interconnected with second connection points of said second plurality of integrated circuit chips;
a connector block mounted on said bottom surface of said substrate for interconnecting external connection features with said first and second connection features;
a generally rectangular top cold plate disposed parallel with said substrate and provided with a first plurality of pockets to accommodate and provide thermal communication with said first plurality of integrated circuit chips, said top cold plate having a first compartment to accommodate said first plurality of integrated circuit chips, said first compartment having a perimeter; and
a generally rectangular bottom heat dissipation plate disposed parallel with said substrate and located opposite said top cold plate with respect to said substrate and provided with a second plurality of pockets to accommodate and provide thermal communication with said second plurality of integrated circuit chips, said connector block passing through a connector cutout in said bottom heat dissipation plate, said bottom heat dissipation plate having a second compartment to accommodate said second plurality of integrated circuit chips, said second compartment having a perimeter, the perimeter of said first compartment being in direct contact with the perimeter of said second compartment to create a thermal conduction path from said bottom heat dissipation plate to said top cold plate along the entirety of the perimeters such that said top cold plate and said bottom heat dissipation plate together completely encase said first and second pluralities of integrated circuit chips except for the connector cutout.

10. The multi-chip module package of claim 9 wherein said cold plate has first and second opposing surfaces, said first surface of said cold plate being in thermal communication with the at least one of said first plurality of integrated circuit chips, said second surface of said cold plate having a groove formed therein in a serpentine pattern, said groove having copper tubing pressed therein to receive a circulating coolant, said copper tubing having first and second ends with said first end in fluid communication with a first manifold block located at a first corner of said cold plate and said second end in fluid communication with a second manifold block located at a second corner of said cold plate opposite said first corner.

11. The multi-chip module package of claim 9 further comprising a planar board connected to said connector block.

12. The multi-chip module package of claim 9 wherein the perimeter of said cold plate has one or more thermal conduction fins which mate with one or more corresponding thermal conduction slots formed along the perimeter of said bottom heat dissipation plate, and further comprising thermal interface material disposed in a gap between one of said thermal conduction fins and one of said thermal conduction slots.

13. The multi-chip module package of claim 9 wherein said substrate is held between said cold plate and said bottom heat dissipation plate using support ribs of said cold plate and said bottom heat dissipation plate which forcibly abut portions of said substrate, and said cold plate is secured to said bottom heat dissipation plate.

14. The multi-chip module package of claim 13 further comprising first thermal interface material disposed in a first gap between said cold plate and the at least one of said first plurality of integrated circuit chips, and second thermal interface material disposed in a second gap between said bottom heat dissipation plate and the at least one of said second plurality of integrated circuit chips, wherein said gaps have dimensions which are determined by said support ribs.

15. The multi-chip module package of claim 9 wherein the at least one of said first plurality of integrated circuit chips includes a computationally-intensive chip which generates more heat than any of the second plurality of integrated circuit chips.

16. A central electronic complex drawer for a computer system comprising:
a chassis;
a planar board supported by said chassis;
a plurality of multi-chip module (MCM) packages mounted on said planar board in an array of rows and columns, each MCM package having
a planar substrate with top and bottom surfaces,
a first plurality of integrated circuit chips mounted on said top surface of said substrate,
a second plurality of integrated circuit chips mounted on said bottom surface of said substrate,
a connector block mounted on said bottom surface of said substrate and connected to respective connection features of said planar board,
a generally rectangular top cold plate disposed parallel with said substrate and provided with a first plurality of pockets to accommodate and provide thermal communication with said first plurality of integrated circuit chips, said top cold plate having a conduit therein for receiving a circulating coolant, said conduit having first and second ends, and said top cold plate having a first compartment to accommodate said first plurality of integrated circuit chips, said first compartment having a perimeter, and
a generally rectangular bottom heat dissipation plate disposed parallel with said substrate and located opposite said top cold plate with respect to said substrate and provided with a second plurality of pockets to accommodate and provide thermal communication with said second plurality of integrated circuit chips, said connector block passing through a connector cutout in said bottom heat dissipation plate, and a perimeter of said top cold plate being in direct thermal communication with a perimeter of said bottom heat dissipation plate, said bottom heat dissipation plate having a second compartment to accommodate said second plurality of integrated circuit chips, said second compartment having a perimeter, the perimeter of said first compartment being in direct contact with the perimeter of said second compartment to create a thermal conduction path from said bottom heat dissipation plate to said top cold plate along the entirety of the perimeters;

a plurality of feeder pipes in fluid communication with the first ends of the conduits in the cold plates;

a plurality of collection pipes in fluid communication with the second ends of the conduits in the cold plates;

a supply manifold which branches out into said feeder pipes;

return manifold which branches out into said collection pipes;

a fluid inlet connected to said supply manifold; and a fluid outlet connected to said return manifold.

17. The central electronic complex drawer of claim 16 wherein:

a given row of the array includes at least first, second, third and fourth MCM packages, said first MCM package being located at a first end of the given row, said second MCM package being located between said first and third MCM packages, said third MCM package being located between said second and fourth MCM packages, and said fourth MCM package being located at a second end of the given row opposite said first end;

a first end of a first conduit in the first MCM package is connected to a first one of said feeder pipes;

a second end of the first conduit in the first MCM package is connected to a first end of a first pipe link;

a second end of the first pipe link is connected to a first end of a second conduit in the third MCM package;

a second end of the second conduit in the third MCM package is connected to a first one of said collection pipes;

a first end of a third conduit in the second MCM package is connected to a second one of said feeder pipes;

a second end of the third conduit in the second MCM package is connected to a first end of a second pipe link;

a second end of the second pipe link is connected to a first end of a fourth conduit in the fourth MCM package; and a second end of the fourth conduit in the fourth MCM package is connected to a second one of said collection pipes.

18. The central electronic complex drawer of claim 16 wherein said fluid inlet and said fluid outlet are located at a rear side of said chassis, and further comprising power connections for said planar board located at a front side of said chassis wherein the front side is located opposite the rear side with respect to said array.

19. The central electronic complex drawer of claim 16 wherein a given MCM package is mounted to said planar board along a bottom side of said given MCM package, and has the conduit along a top side of said given MCM package.

20. A package for an integrated circuit chip module comprising:

a generally planar substrate having first and second opposing surfaces;

a plurality of integrated circuit chips mounted on said first surface of said substrate;

a first heat sink provided with a plurality of pockets to accommodate and provide thermal communication with said plurality of integrated circuit chips, said first heat sink having sides forming a perimeter; and a second heat sink located opposite said first heat sink with respect to said substrate, said second heat sink having sides forming a perimeter which is in continuous direct contact with the perimeter of said first heat sink such that said first and second heat sinks together substantially surrounding said integrated circuit chips on all sides.

* * * * *